United States Patent
Yagi

(10) Patent No.: US 7,164,115 B2
(45) Date of Patent: Jan. 16, 2007

(54) PHOTOELECTRIC CONVERSION APPARATUS, MANUFACTURING METHOD THEREFOR, AND X-RAY IMAGING APPARATUS

(75) Inventor: Tomoyuki Yagi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 177 days.

(21) Appl. No.: 10/786,785

(22) Filed: Feb. 24, 2004

(65) Prior Publication Data

US 2004/0179649 A1 Sep. 16, 2004

(30) Foreign Application Priority Data

Feb. 28, 2003 (JP) ............... 2003-054519

(51) Int. Cl.
  H01L 31/00 (2006.01)
  H01L 27/00 (2006.01)
  H01L 25/00 (2006.01)
  H05G 1/70 (2006.01)

(52) U.S. Cl. ............... 250/214.1; 250/208.1; 250/370.09; 378/92

(58) Field of Classification Search ......... 438/96, 438/97, 57, 59, 66, 69; 257/53, 54; 250/578.1, 250/208.1, 370.14, 214.1, 214 R, 370.09; 378/46, 92, 98.3, 98.7, 98.9, 98.8
See application file for complete search history.

(56) References Cited

U.S. PATENT DOCUMENTS

| 5,448,613 | A | | 9/1995 | Haendle et al. | |
|---|---|---|---|---|---|
| 6,075,256 | A | * | 6/2000 | Kaifu et al. | 257/53 |
| 6,895,078 | B1 | * | 5/2005 | Alving et al. | 378/98.7 |
| 6,944,266 | B1 | * | 9/2005 | Yamazaki et al. | 379/98.7 |
| 6,952,465 | B1 | * | 10/2005 | Hirai et al. | 378/98.8 |

* cited by examiner

Primary Examiner—Georgia Epps
Assistant Examiner—Don Williams
(74) Attorney, Agent, or Firm—Morgan & Finnegan, LLP.

(57) ABSTRACT

In an X-ray imaging apparatus, an optical sensor (phototimer detection unit) corresponding to a conventional photomultiplier is incorporated in a two-dimensional sensor (on a signal line), and a signal from the phototimer detection unit is integrated and monitored, thereby performing exposure control. This makes it possible to incorporate the phototimer detection unit without affecting the aperture ratio of pixels which influence the performance of the X-ray imaging apparatus and the characteristics of a MIS type photoelectric conversion unit, thereby performing proper exposure control.

12 Claims, 13 Drawing Sheets

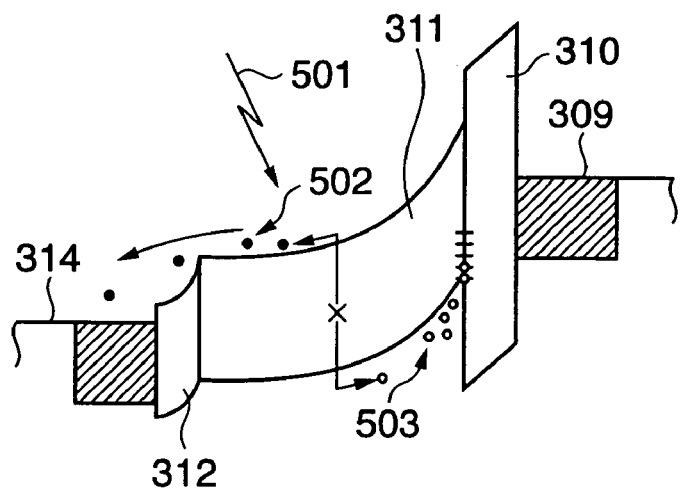
FIG. 4A PHOTOELECTRIC CONVERSION MODE
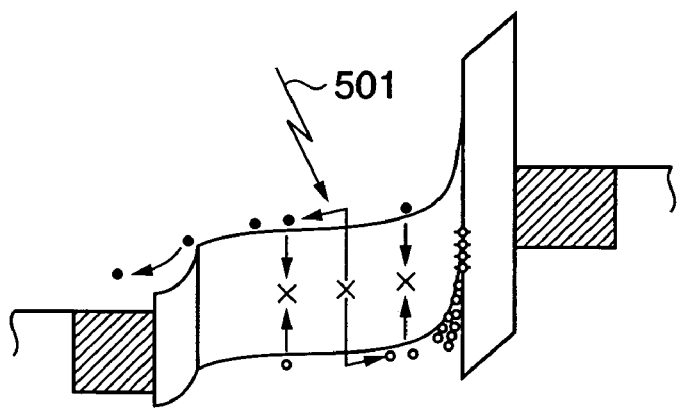
FIG. 4B SATURATED STATE
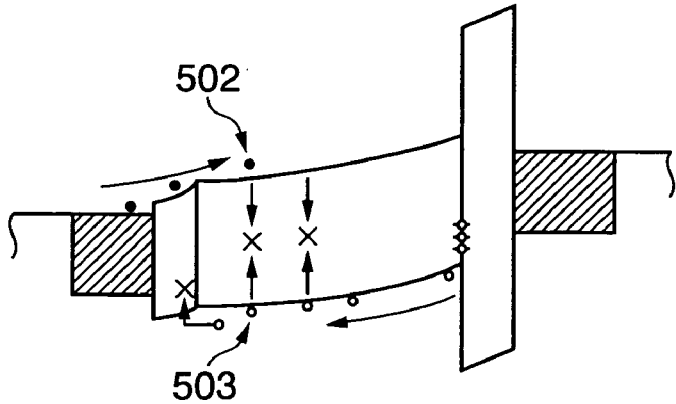
FIG. 4C REFRESH OPERATION

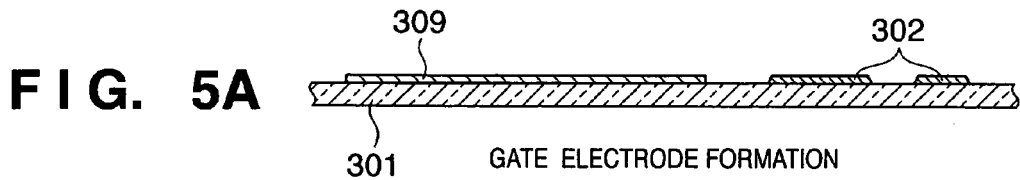
FIG. 5A  GATE ELECTRODE FORMATION
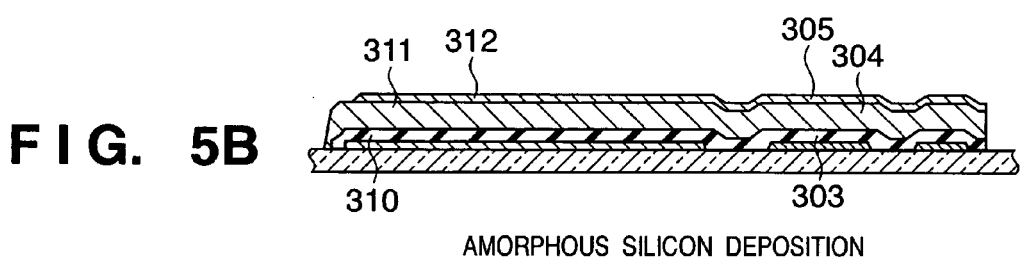
FIG. 5B  AMORPHOUS SILICON DEPOSITION
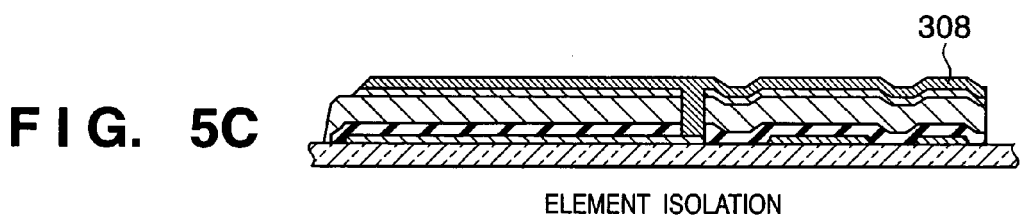
FIG. 5C  ELEMENT ISOLATION
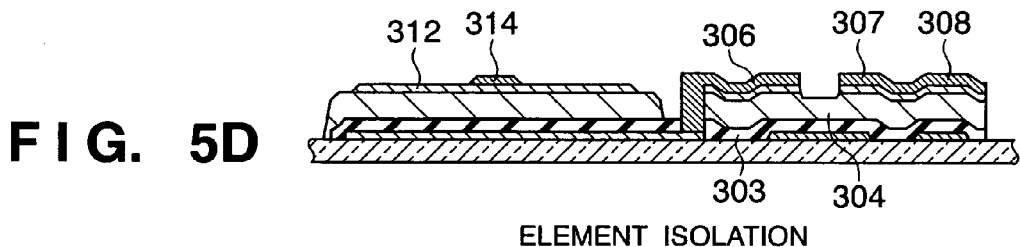
FIG. 5D  ELEMENT ISOLATION
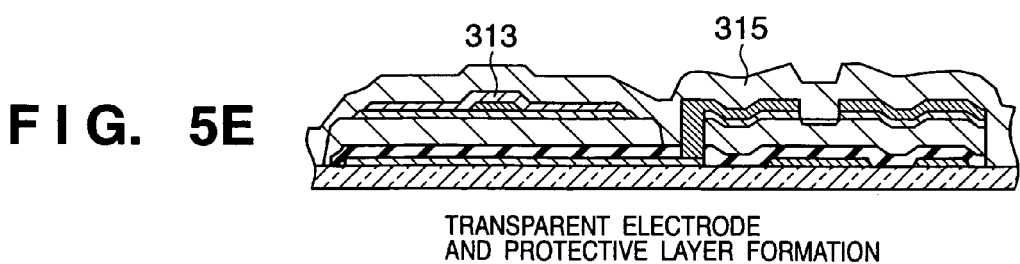
FIG. 5E  TRANSPARENT ELECTRODE AND PROTECTIVE LAYER FORMATION

BAND DIAGRAM IN DARK STATE

BAND DIAGRAM IN IRRADIATED STATE

PHOTOELECTRIC CONVERSION APPARATUS, MANUFACTURING METHOD THEREFOR, AND X-RAY IMAGING APPARATUS

FIELD OF THE INVENTION

The present invention relates to a photoelectric conversion apparatus, a manufacturing method thereof, and an X-ray imaging apparatus and, more particularly, to a photoelectric conversion apparatus, a manufacturing method therefor, and an X-ray imaging apparatus which are suitable for exposure control.

BACKGROUND OF THE INVENTION

In X-ray radiography, an automatic exposure control device (phototimer) is widely used. The phototimer is placed behind or in front of a film to convert X-rays transmitted through an object to be radiographed into an electrical signal, and shuts off X-rays when the integral of this electrical signal reaches a predetermined value, thereby keeping the density of an X-ray image constant.

FIG. 13 shows the arrangement of a conventional phototimer.

As shown in FIG. 13, the phototimer is constituted by a phosphor 108 and photomultiplier 112. The phototimer converts X-rays 102 transmitted through a human body 103 into light by using the phosphor 108, guides the light to the photomultiplier 112 through a lightguide 111, and converts the light, converted by the photomultiplier 112, into an electrical signal.

The electrical signal output from the photomultiplier 112 in this manner is stored in an integrating capacitor 113. The voltage generated by the integrating capacitor 113 when the electrical signal is stored is monitored by a processing circuit 114 constituted by a comparator 115 and density setting device 116.

When the voltage reaches a predetermined value, the processing circuit 114 sends a signal for shutting off the X-rays 102 (X-ray source control signal 117) to an X-ray source 101.

In general, one or a plurality of phototimers based on the above principle are mounted in the X-ray imaging apparatus to control the X-rays 102.

Recently, a digital X-ray imaging apparatus has been put into practice (see, e.g., U.S. Pat. No. 5,448,613), which is a combination of a two-dimensional sensor formed by depositing amorphous silicon on a glass substrate, a photoelectric conversion apparatus to which a driver circuit which drives transistors and amplifiers for amplifying signals from the two-dimensional sensor are connected, and a phosphor.

This digital X-ray imaging apparatus is designed to convert X-rays transmitted through a human body into an electrical signal, store an image as digital information, and output it. The performance of the digital X-ray imaging apparatus is equal to or higher than that of a conventional film type X-ray imaging apparatus.

The above digital X-ray imaging apparatus is becoming popular in the medical field because of its advantages, that are unnecessity of developing, ease of image processing, and ease of storage and transfer of data.

For exposure control in such a digital X-ray imaging apparatus, a phototimer like that used in a film type X-ray imaging apparatus is used.

A phototimer, however, roughly has two problems: one based on the sensitivity difference between a means for obtaining an X-ray image and the phototimer, and the other based on the number of phototimers to be installed.

In a conventional phototimer, light from a phosphor is converted into an electrical signal by a photomultiplier. Even if, therefore, the same phosphor as that used for X-ray radiography is used, the principle of the sensitivity of a film or the photoelectric conversion apparatus differs from that of the phototimer.

Conventionally, therefore, the characteristics of the phototimer are electrically corrected to become identical to those of the X-ray imaging apparatus, thereby compensating for the sensitivity difference. It is, however, difficult to precisely match the sensitivity characteristics (tube voltage characteristics and linearity), signal-to-noise ratio (S/N ratio), and offset amount of the phototimer with those of the X-ray imaging apparatus. Consequently, accurate exposure precision cannot be obtained.

In order to perform accurate exposure at any region, phototimers must be installed at positions corresponding to the respective regions. In consideration of installation places and cost, it is not realistic to install phototimers at positions corresponding to various regions.

Assume that phototimers are arranged for chest radiography alone. Even in this case, since there are physical differences between adults and children, and different densities are required depending on diagnostic regions, exposure control cannot always be relied on the phototimers.

Owing to the above problems, according to the conventional techniques, even if an X-ray imaging apparatus is equipped with phototimers, radiography cannot be relied on the phototimers in all radiographic conditions. The real situation is that radiography with proper exposure needs to be relied on the experiences of technicians regardless of whether a film type apparatus or digital apparatus is used.

In order to reduce failures in radiography, therefore, a patient is irradiated with a relatively high dose of X-rays to increase the contrast, resulting in an increase in the radiation dose of the patient.

In order to make a conventional phototimer comply with an X-ray imaging apparatus having a new principle or mechanism such as a digital X-ray imaging apparatus, it is necessary to match the sensitivity characteristics of the phototimer with those of a sensor used in the X-ray imaging apparatus. This requires many verifications.

At an early stage of proliferation of digital X-ray imaging apparatuses on the market, only a small amount of clinical data has been obtained, leading to poor exposure precision. These problems have interfered with the development and widespread use of X-ray imaging apparatuses.

SUMMARY OF THE INVENTION

The present invention has been made in consideration of the above problems, and has as its object to easily and reliably perform proper exposure control in executing radiography.

The first aspect of the present invention relates to a photoelectric conversion apparatus in which a read unit for amplifying and reading electric charge transferred by a transfer device and a driving unit for driving the transfer means a connected to a two-dimensional sensor two-dimensionally having a plurality of pixels each formed from a combination of a photoelectric conversion element which converts radiation or visible light into an electrical signal and generates electric charge and the transfer device for transferring the electric charge generated by the photoelectric conversion element at an arbitrary timing, comprising a phototimer detection unit for detecting the radiation or visible light to control exposure of the radiation or visible light, wherein a common path is used both as a signal transmission path which connects the transfer device to the read unit and a signal transfer path of the phototimer detection unit.

The second aspect of the present invention relates to a photoelectric conversion apparatus comprising a two-dimensional sensor having a plurality of pixels, in the form of a matrix, each formed from a combination of a photoelectric conversion element which converts radiation or visible light into an electrical signal and generating electric charge and a transfer device for transferring the electric charge generated by the photoelectric conversion element, a read unit for amplifying and reading the electric charge transferred by the transfer device, and a phototimer detection unit for detecting the radiation or visible light to control exposure of the radiation or visible light, wherein a common path is used both as a signal transmission path which connects the transfer device to the read unit and a signal transfer path of the phototimer detection unit.

The third aspect of the present invention relates to the apparatus as described above, wherein the photoelectric conversion element includes an insulating substrate, a first electrode layer formed on the insulating substrate, a first injection blocking layer which is formed on the first electrode layer and blocks injection of carriers having a first conductivity type, a photoelectric conversion semiconductor layer formed on the first injection blocking layer by using a non-single semiconductor, a second injection blocking layer which is formed on the photoelectric conversion semiconductor layer and blocks injection of carriers having a second conductivity type different in sign from the carriers of the first conductivity type, a second electrode layer which is formed on the second injection blocking layer and transparent to visible light, and a third electrode which is formed between the second electrode layer and the second injection blocking layer by using a metal.

The forth aspect of the present invention relates to an X-ray imaging apparatus comprising, a photoelectric conversion apparatus as described above, and a phosphor which is bonded on a light-receiving surface of the photoelectric conversion apparatus, wherein the phosphor converts X-rays into visible light.

The fifth aspect of the present invention relates to an X-ray imaging apparatus comprising, a photoelectric conversion apparatus as described above, an electrical signal read unit for reading an electrical signal on the basis of X-rays detected by the phototimer detection unit of the photoelectric conversion apparatus, and an exposure control unit for determining an exposure from an electrical signal read by the electrical signal read unit, and controls an X-ray source to obtain an image having an optimal contrast.

The sixth aspect of the present invention relates to a method of manufacturing a photoelectric conversion apparatus, comprising, a step of forming a first conductive layer on an insulating substrate, and forming a sensor electrode and a gate electrode by etching the formed first conductive layer, a step of sequentially forming a first insulating layer and first and second amorphous semiconductor layers on the formed sensor electrode and gate electrode, a step of etching the first insulating layer and first and second amorphous semiconductor layers formed in a predetermined area on the sensor electrode, forming a second conductive layer on the etched layers, and etching the formed second conductive layer to form a sensor bias line above the sensor electrode and form a source electrode layer, drain electrode layer, and signal line above the gate electrode, and a step of forming an electrode transparent to visible light on an area in which the sensor bias line and the second amorphous semiconductor layer are exposed.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 4A to 4C are views showing the energy band of a MIS type photoelectric conversion unit according to the first embodiment of the present invention;

FIGS. 5A to 5E are schematic sectional views sequentially showing the manufacturing steps of a pixel according to the first embodiment of the present invention;

DETAILED DESCRIPTION OF THE PREFERRED EMBODIMENTS

The embodiments of the present invention will be described in detail next with reference to the accompanying drawings. In the first to fourth embodiments to be described below, in order to solve the above problems, a phototimer is formed on a signal line for sending an electrical signal stored in a photoelectric conversion element to a read unit which amplifies and reads out the signal in a two-dimensional sensor.

(First Embodiment)

The first embodiment of the present invention will be described.

Figure 1:
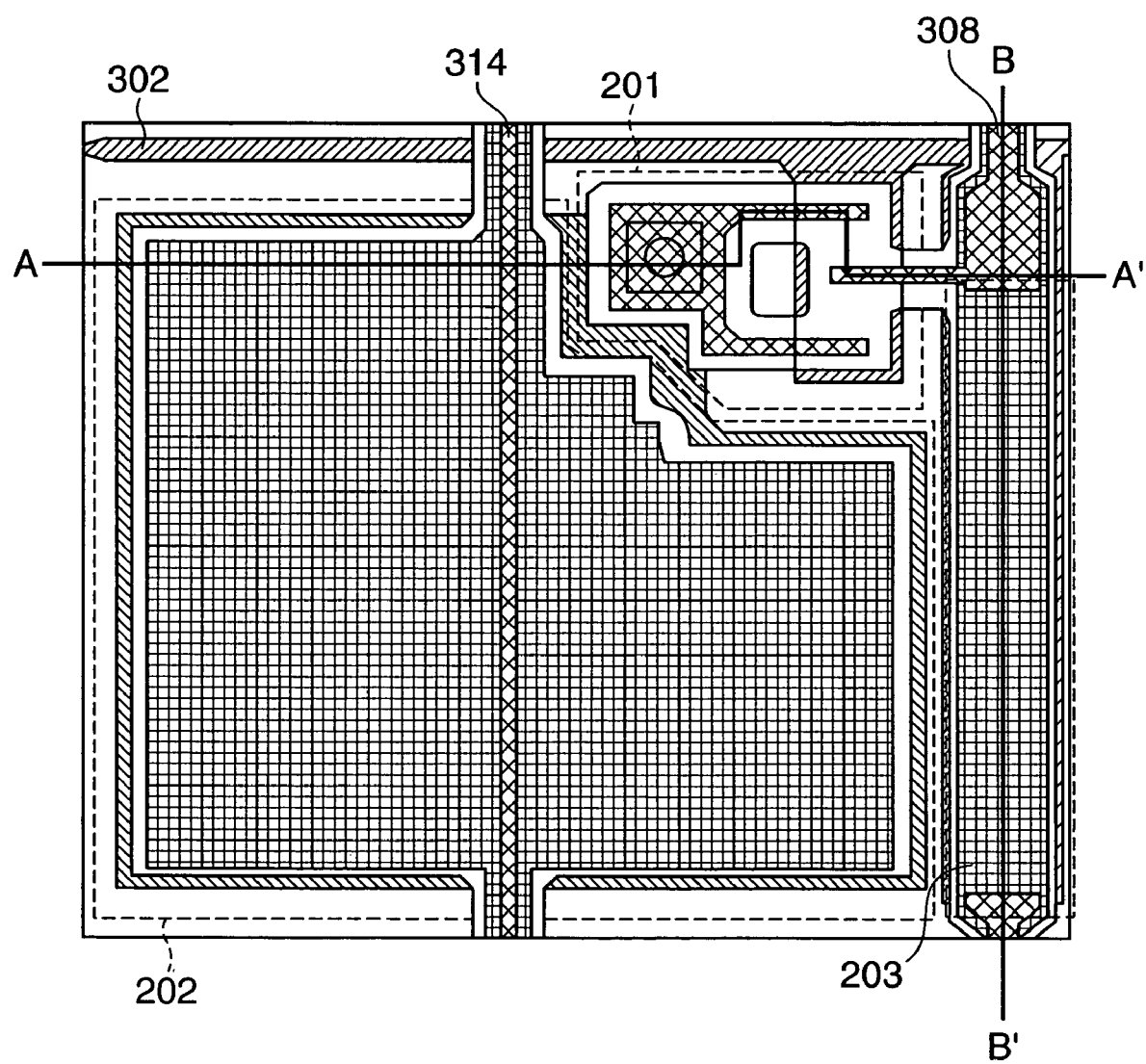
FIG. 1 is a plan view showing an example of one pixel of a two-dimensional sensor according to the first embodiment of the present invention.

FIG. 1 is a view showing an example of one pixel of the two-dimensional sensor used in a digital X-ray imaging apparatus according to the first embodiment of the present invention. For the sake of convenience, FIG. 1 shows no phosphor or the like.

Each pixel of the two-dimensional sensor has a MIS (Metal-Insulator-Semiconductor) type photoelectric conversion unit 202 placed as a photoelectric conversion element which converts visible light emitted from a phosphor into an electrical signal and stores it, and a TFT (Thin-Film-Transistor) 201 placed as a transfer device for transferring the electric charge stored in the MIS type photoelectric conversion unit 202.

A gate electrode 302, sensor bias line 314, and signal line 308 are connected to the above pixel. The gate electrode 302 drives the TFT 201. The sensor bias line 314 applies a voltage required for photoelectric conversion or electric charge storage to the MIS type photoelectric conversion unit 202. The signal line 308 sends an electrical signal from the TFT 201 to a read circuit (not shown in FIG. 1).

A phototimer detection unit 203 which is a characteristic feature of this embodiment is formed in the signal line 308, as shown in FIG. 1. Forming the phototimer detection unit 203 on the signal line 308 in this manner makes it possible to incorporate the phototimer detection unit 203 for exposure control without affecting the aperture ratio of pixels which influence the performance of the X-ray imaging apparatus and the characteristics of the MIS type photoelectric conversion unit 202.

Figure 2:
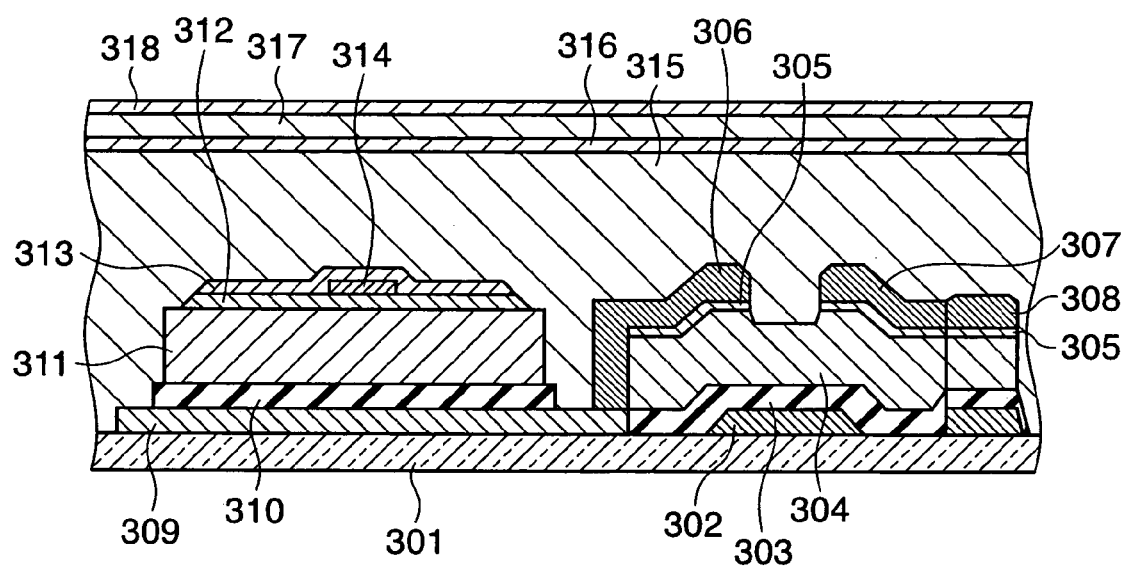
FIG. 2 is a sectional view taken along a line A–A' of one pixel of the two-dimensional sensor shown in FIG. 1 according to the first embodiment of the present invention.

FIG. 2 is a sectional view taken along a line A–A' in FIG. 1.

The above pixel is formed on a glass substrate 301. The TFT 201 is constituted by the gate electrode 302 made of chromium, aluminum, or an aluminum alloy, an insulating film 303 formed from an amorphous silicon nitride film, a channel layer 304 made of amorphous silicon hydride (a-Si: H), an N$^+$ amorphous silicon layer 305 for ohmic contact between the channel layer 304 and a metal electrode, and source and drain electrodes 306 and 307 which are made of a metal such as aluminum or an aluminum alloy.

The MIS type photoelectric conversion unit 202 in this embodiment is a MIS type amorphous silicon photosensor, which is constituted by a sensor lower electrode 309 formed on the glass substrate 301 by using a metal such as chromium, aluminum, or an aluminum alloy, an insulating layer 310 formed from a thin silicon nitride film serving as an insulating layer of the MIS type photoelectric conversion unit (photosensor) 202, a photoelectric conversion layer 311 made of amorphous silicon hydride which converts visible light into an electrical signal, an N$^+$ type amorphous silicon layer 312 which obtains ohmic contact between the photoelectric conversion layer 311 and an electrode and blocks the injection of holes from a sensor bias line 314, a transparent electrode 313 which is made of ITO (Indium Tin Oxide) and applies a voltage to the MIS type photoelectric conversion unit (photosensor) 202, and the sensor bias line 314 made of aluminum or chromium.

In addition, the following are formed above the TFT 201 and MIS type photoelectric conversion unit 202: a protective layer 315 for protecting the MIS type photoelectric conversion unit (photosensor) 202 and the TFT 201 against humidity and foreign substances, a phosphor 317 which converts radiation into visible light, a bonding layer 316 for bonding the phosphor 317, and a phosphor protective layer 318 for protecting the phosphor 317 against humidity.

The reason why an amorphous silicon process is used for a two-dimensional sensor in this manner is that a film having a large area can be uniformly formed, and the characteristics of the MIS type photoelectric conversion unit 202 and TFT 201 can be made uniform.

Figure 3:
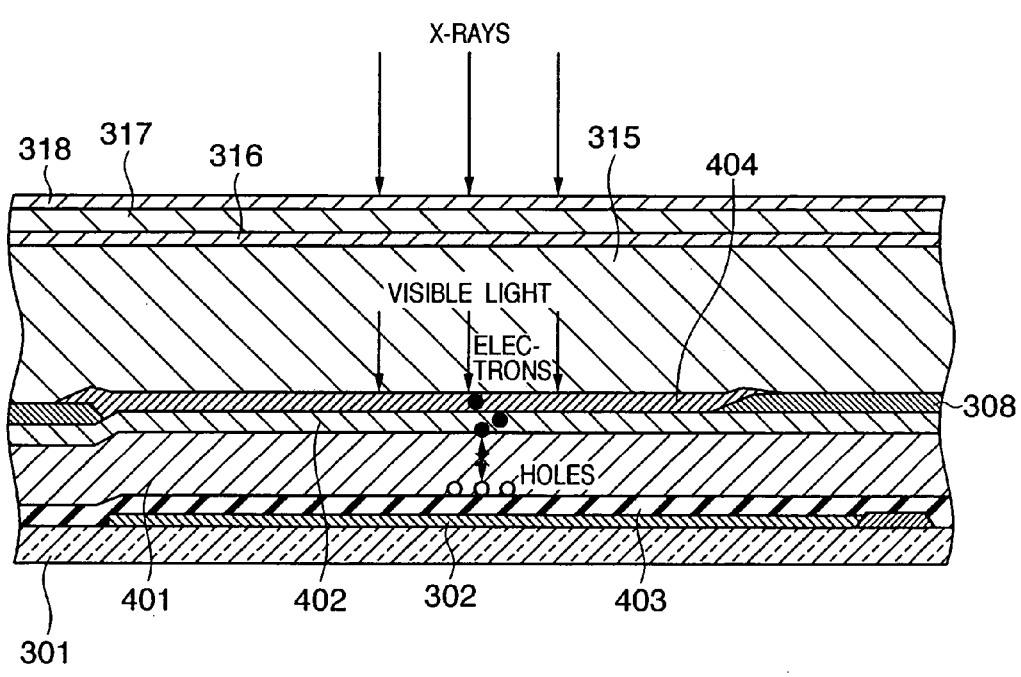
FIG. 3 is a sectional view taken along a line B–B' of one pixel of the two-dimensional sensor shown in FIG. 1 according to the first embodiment of the present invention.

FIG. 3 is a sectional view taken along a line B–B' in FIG. 1.

The phototimer detection unit 203 in this embodiment has almost the same layer arrangement as that of the MIS type photoelectric conversion unit 202.

More specifically, the phototimer detection unit 203 includes the gate electrode 302 of the TFT 201 which is formed on the glass substrate 301 and has the same function as that of the sensor lower electrode 309, an insulating layer 403 having the same function as that of the insulating layer 310, a photoelectric conversion layer 401 made of amorphous silicon hydride which converts visible light into an electrical signal, an N$^+$ amorphous silicon layer 402 which obtains ohmic contact between the photoelectric conversion layer 401 and a transparent electrode 404 and blocks the injection of holes from the signal line 308, and the transparent electrode 404 which applies a voltage necessary for photoelectric conversion to the phototimer detection unit 203 and is sufficiently transparent to guide visible light to the photoelectric conversion layer 401.

As shown in FIG. 1, all these components are formed in the same place as that of the signal line 308. In addition, the transparent electrode 404 functions as a signal line as well as having the function of applying a voltage to the phototimer detection unit 203 and extracting a signal.

In this phototimer detection unit 203, visible light carrying an X-ray signal emitted from the phosphor 317 is incident on the photoelectric conversion layer 401 through the transparent electrode 404 formed to be flush with the signal line 308. The incident light is converted into electrons and holes by the photoelectric conversion layer 401 with its photoelectric effect. The electrons are sent as exposure information through the signal line 308.

The operation principles of the MIS type photoelectric conversion unit 202 and phototimer detection unit 203 in this embodiment will be described with reference to the energy band diagrams of the MIS type photoelectric conversion unit 202 shown in FIGS. 4A to 4C.

The state shown in FIG. 4A indicates storing operation (photoelectric conversion mode) in which a positive voltage is applied to the sensor bias line 314 of the MIS type photoelectric conversion unit 202.

In this photoelectric conversion mode, holes 503 generated in the photoelectric conversion layer 311 by an electric field in the photoelectric conversion layer 311 owing to the photoelectric effect move to the interface between the insulating layer 310 and the photoelectric conversion layer 311 (photoelectric conversion layer-insulating layer interface), and electrons move toward the N$^+$ type amorphous silicon layer 312.

At this time, the holes 503 cannot move through the insulating layer 310 and hence are stored on the photoelectric conversion layer-insulating layer interface. Therefore, the MIS type photoelectric conversion unit 202 generates a voltage proportional to the dose and irradiation time of light.

When holes 503 are stored in a given amount, the voltage originating from the holes 503 stored in the photoelectric conversion layer—insulating layer interface becomes equal to the voltage applied to the MIS type photoelectric conversion unit (photosensor) 202. Consequently, no electric field is generated in the photoelectric conversion layer 311.

In this state, the holes 503 generated in the photoelectric conversion layer 311 cannot move to the photoelectric conversion layer—insulating layer interface and recombine with the electrons 502 to disappear. As a consequence, no voltage is generated which is proportional to the dose and irradiation time of light. This state is called a saturated state.

In the MIS type photoelectric conversion unit 202 in the saturated state, no voltage is generated which is proportional to the dose and irradiation time of light. In this state, therefore, no normal X-ray image can be obtained by radiography.

In order to set the MIS type photoelectric conversion unit 202 in the state shown in FIG. 4A (photoelectric conversion mode) again, holes must be swept out of the photoelectric conversion layer—insulating layer interface by setting the voltage of the sensor bias line 314 to a voltage lower than that in the states shown in FIGS. 4A and 4B. This operation is called refresh operation.

At this time, new holes 503 can be stored in an amount equal to the amount of holes 503 swept out by setting the voltage of the sensor bias line 314 to a lower voltage. Immediately after the refresh operation changes to the photoelectric conversion mode, a current due to the electrons 502 injected into the photoelectric conversion layer 311 in the refresh operation flows, resulting in a temporary increase in dark current.

Setting the voltage of the sensor bias line 314 to a lower voltage can make it more difficult for the sensor to become saturated even with irradiation with a large amount of light. However, as the voltage of the sensor bias line 314 in refresh operation is decreased, the amount of electrons injected into the photoelectric conversion layer 311 in the refresh operation increases, resulting in generating more current than when the voltage (bias) of the sensor bias line 314 is returned to the voltage (bias) set in the storing operation.

The difference between the sensor bias in refresh operation and that in the photoelectric conversion mode is so set as to ensure the dynamic range of the sensor (MIS type photoelectric conversion unit 202) and sufficiently reduce the dark current.

The phototimer detection unit 203 shares the gate electrode 302 and signal line 308 with the TFT 201. For this reason, voltages for setting the phototimer detection unit 203 in the photoelectric conversion mode and refresh mode and a voltage for driving the gate of the TFT 201 must be set to be optimal for both the TFT 201 and the phototimer detection unit 203.

According to the above description, in order to make the MIS type photoelectric conversion unit 202 and phototimer detection unit 203 generate outputs proportional to the dose and irradiation time of light, a series of operations, i.e., storing operation→light irradiation→signal→reading refresh operation, must be repeated.

FIGS. 5A to 5E sequentially show the manufacturing steps of a pixel in this embodiment.

In forming the TFT 201 and MIS type photoelectric conversion unit 202, first of all, a chromium, aluminum, or aluminum film serving as the gate electrode 302 and sensor lower electrode 309 is formed on the glass substrate 301 by sputtering.

The metal film formed on the glass substrate 301 in this manner is separated into the gate electrode 302 and sensor lower electrode 309 by lithography and etching (the gate electrode forming step in FIG. 5A).

The following films are then sequentially deposited by a chemical vapor deposition (CVD) method, a plasma CVD method, or the like: an amorphous silicon nitride film serving as the insulating film 303 of the TFT 201 and the insulating layer 310 of the MIS type photoelectric conversion unit 202; an amorphous silicon hydride film serving as the channel layer 304 of the TFT 201 and the photoelectric conversion layer 311 of the MIS type photoelectric conversion unit 202; and an amorphous silicon hydride film serving as the $N^+$ amorphous silicon layers 305 and 312 which are doped with an impurity to have n-type conductivity (the amorphous silicon deposition step in FIG. 5B).

After a hole is formed in a portion of the amorphous silicon film on the sensor lower electrode 309 in the state shown in FIG. 5B by a plasma etching method or the like, an aluminum or aluminum alloy film serving as the signal line 308, the source electrode 306 and drain electrode 307 of the TFT 201, and the sensor bias line 314 is formed by a sputtering method (the electrode layer forming step in FIG. 5C).

In order to isolate the TFT 201 and MIS type photoelectric conversion unit 202, the electrode layer and the respective semiconductor layers are removed by lithography and etching to form the TFT 201 and MIS type photoelectric conversion unit 202 (the inter-element isolation step in FIG. 5D).

At this time, a metal film in the region formed into the phototimer detection unit 203 is removed by etching.

Lastly, after the transparent electrode 313 made of ITO or the like is deposited by sputtering, unnecessary portions are removed by lithography and etching. Thereafter, an amorphous silicon nitride film serving as the protective layer 315 which protects the TFT 201 and MIS type photoelectric conversion unit 202 against dust and moisture is deposited by a CVD method or plasma CVD method (the transparent electrode/protective layer forming step in FIG. 5E).

According to the method described above, the TFT 201, MIS type photoelectric conversion unit 202, and phototimer detection unit 203 can be formed in one process. This makes it possible to realize a reduction in cost and increases in the quality and performance of the X-ray imaging apparatus.

In this case, the respective layers have thicknesses optimized to realize the performance of the TFT 201 and MIS type photoelectric conversion unit 202 which is required as the X-ray imaging apparatus.

Figure 6:
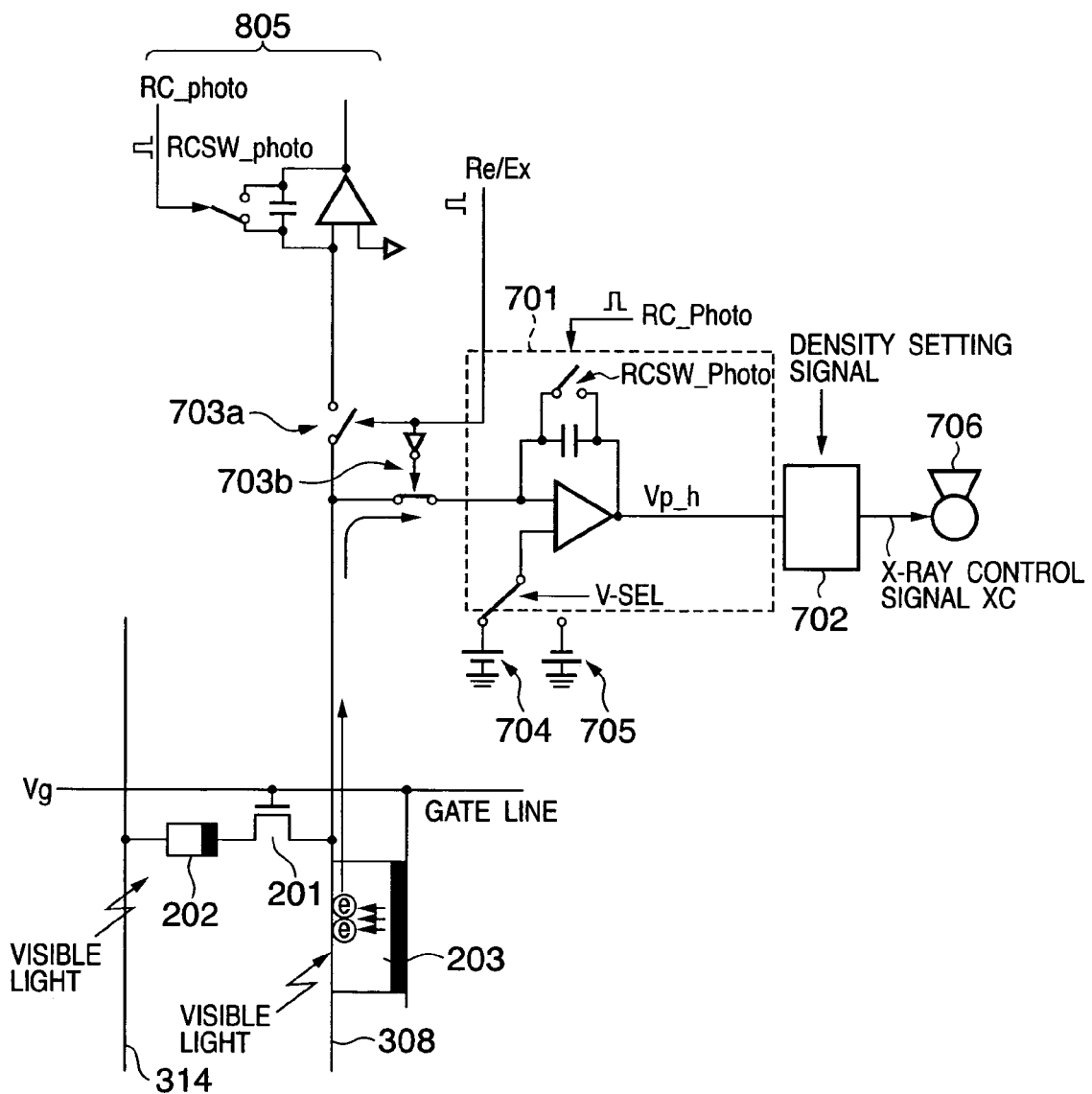
FIG. 6 is a circuit diagram of a phototimer according to the first embodiment of the present invention.

FIG. 6 is a circuit diagram of a phototimer in this embodiment.

The phototimer includes the phototimer detection unit 203 described above, a phototimer amplification unit 701 formed from a charge-integrating amplifier which stores and amplifies an electrical signal from the phototimer detection unit 203, an exposure control unit 702 which monitors the voltage output from the phototimer amplification unit 701 and controls an X-ray source 706 to set an optimal exposure, an Re/Ex switch 703 which is placed on the signal line 308 to distribute electrical signals from the signal line 308 to an image signal amplifier 805 and the phototimer amplification unit 701.

The electrical signal output from the phototimer detection unit 203 passes through the signal line 308 and is amplified by the phototimer amplification unit 701. A charge-integrating amplifier is used for the phototimer amplification unit 701, which outputs a voltage in accordance with the integral of a sent charge quantity.

In the circuit shown in FIG. 6, since electrons are sent from the phototimer detection unit 203, the output of the phototimer amplification unit 701 becomes lower than that of a power supply 704 for storage.

That is, a voltage value Vp_h output from the phototimer amplification unit 701 decreases in proportion to the dose of X-ray to the X-ray imaging apparatus and the irradiation time of X-rays, i.e., the intensity of visible light emitted from the phosphor 317 and the emission time.

The voltage Vp_h is monitored by the exposure control unit 702 and reaches a desired voltage value, an X-ray control signal XC is sent to the X-ray source 706 to stop emitting X-rays.

A voltage value for stopping the emission of X-rays is set by the exposure control unit 702 on the basis of a density setting signal. The density setting signal is output from a computer to the exposure control unit 702. More specifically, the most suitable exposure time is calculated by a computer (not shown in FIG. 6) from the radiographic region input by the operator, a region of interest in diagnosis, and set values for the tube amplifier, and is output as a density setting signal from the computer.

The phototimer amplification unit 701 uses two types of reference power supplies for the amplifier. The two types of reference power supplies are the power supply 704 for storage which is a reference power supply set when X-rays are emitted, and a refresh power supply 705 as a power supply for setting the phototimer detection unit 203 in the refresh mode. These power supplies are properly switched by a control signal V-SEL In order to perform accurate signal amplification, the amplifier must be reset before a signal is sent. For this reason, a capacitor provided in a feedback circuit for the amplifier is properly reset by a reset switch RCSW_Photo. The reset switch RCSW_Photo is controlled by a control signal RC_Photo.

In this case, the respective voltages to be used are optimized in accordance with the dynamic range necessary for the phototimer. In addition, the gain of the amplifier is optimized in consideration of the characteristics of the MIS type photoelectric conversion unit 202 and phototimer detection unit 203.

Figure 7:
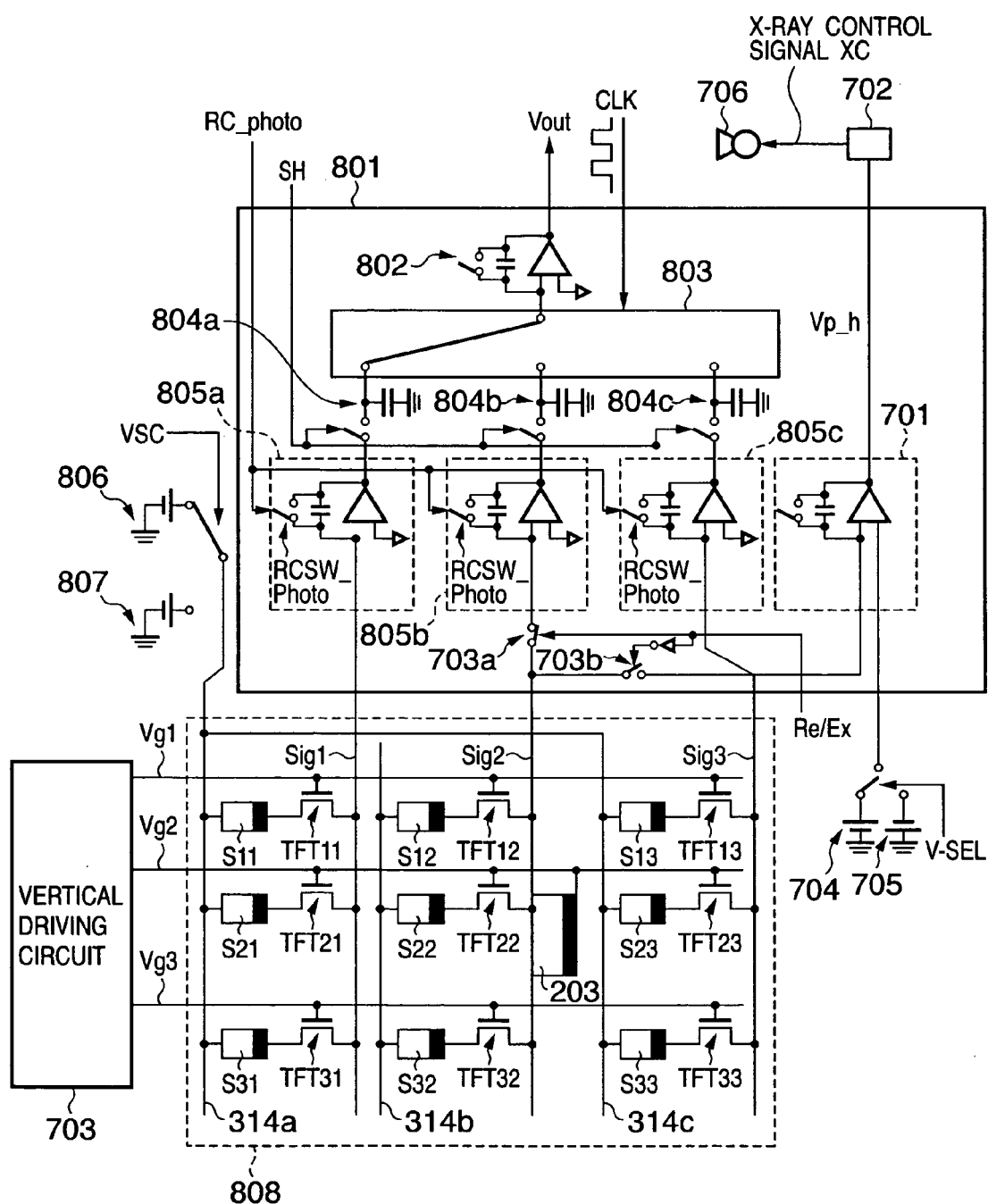
FIG. 7 is a circuit diagram of a photoelectric conversion apparatus according to the first embodiment of the present invention.

FIG. 7 is a circuit diagram of the photoelectric conversion apparatus according to this embodiment. For the sake of descriptive convenience, referring to FIG. 7, a two-dimensional sensor is used, which has a 3×3 pixels and uses the phototimer detection unit 203 for only the central pixel. However, the number of pixels is not limited to this. Likewise, the positions and number of phototimer detection units 203 are not limited to those in this arrangement.

The photoelectric conversion apparatus is roughly constituted by a two-dimensional sensor 808 formed by two-dimensionally (in the form of a matrix) arranging the above pixels on the glass substrate 301, a signal amplification circuit 801 for amplifying/transferring electrical signals from the two-dimensional sensor 808, a vertical driving circuit 703 for driving the TFT 201, and various power supplies 704, 705, and 804 to 807.

The signal amplification circuit 801 includes the image signal amplifier 805 which amplifies an electrical signal sent from the TFT 201, a sample/hold circuit 804 for holding the amplified electrical signal for a predetermined period of time, multiplexer circuit 803 which time-serially reads sampled/held electrical signals, an output stage amplifier 802 for outputting an electrical signal output from the multiplexer circuit 803 with a low impedance to an external circuit, the phototimer amplification unit 701 shown in FIG. 6, and Re/Ex switches such as the Re/Ex switch 703.

The phototimer amplification units 701 and accompanying Re/Ex switches 703 are provided in numbers each corresponding to the number of signal lines on which the phototimer detection units 203 are provided.

For accurate signal amplification, the capacitor provided in the feedback circuit for the image signal amplifier 805 must be reset before a signal is sent. The reset switch RCSW_Photo is provided for this purpose. This switch is controlled by the control signal RC_Photo.

The sample/hold circuit 804 is controlled by a control signal SH. The MIS type photoelectric conversion unit 202 is switched between the photoelectric conversion mode and the refresh mode in accordance with a control signal VSC. The multiplexer circuit 803 outputs a signal in synchronism with a CLK signal CLK input thereto.

Nine TFTs 11 to 33 are ON/OFF-controlled by gate electrodes Vg1, Vg2, and Vg3, respectively.

Referring to FIG. 7, each of the TFTs 11 to 33 is identical to the TFT 201 shown in, for example, FIG. 1. Each of the gate electrodes Vg1, Vg2, and Vg3 is identical to the gate electrode 302 shown in, for example, FIG. 1. Each of MIS type photoelectric conversion units s11 to s33 is identical to the MIS type photoelectric conversion unit 202 shown in, for example, FIG. 1. In addition, each of signal lines Sig1 to Sig3 is identical to the signal line 308 shown in, for example, FIG. 1.

Figure 8:
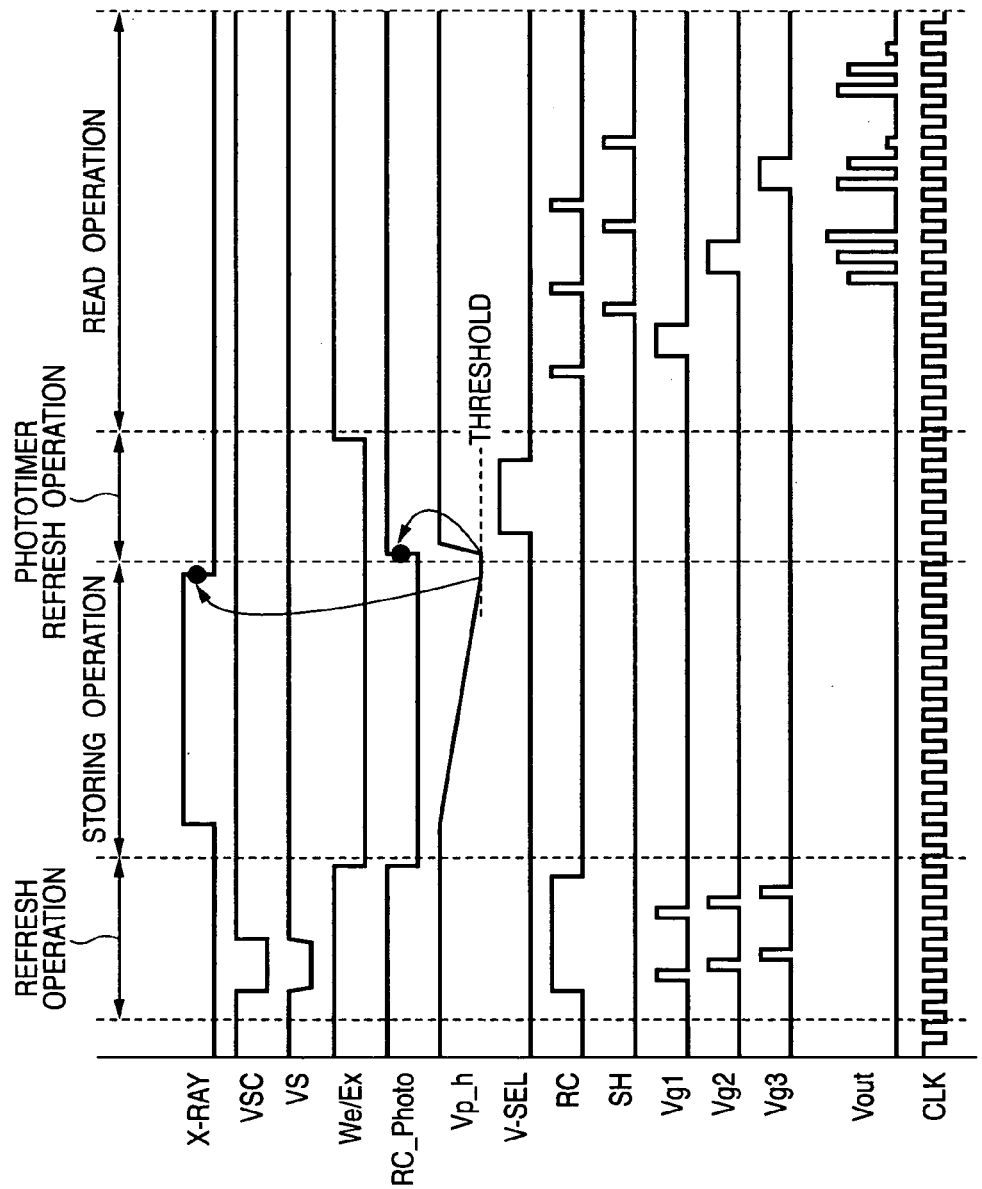
FIG. 8 is a timing chart showing the drive timing for the acquisition of one image according to the first embodiment of the present invention.

FIG. 8 is a timing chart showing a driving timing for the acquisition of one image by using the two-dimensional sensor 808 in FIG. 7.

In order to obtain an X-ray image, the following operation must be sequentially performed: the refresh operation of setting the MIS type photoelectric conversion unit 202 in the refresh mode and sweeping unnecessary electric charge out of the MIS type photoelectric conversion unit 202; the storing operation of emitting X-rays and storing X-rays transmitted through an object as an electrical signal, the phototimer refresh operation of refreshing the phototimer, and the read operation of obtaining an X-ray image by sequentially turning on the TFTs 201.

In the refresh operation, first of all, the control signal VSC is set at Low to connect the sensor bias line 314 to a refresh bias 807 to set the MIS type photoelectric conversion unit 202 (s11 to s33) of each pixel in the refresh mode. The TFTs 201 (TFT11 to TFT33) of the respective pixels are simultaneously turned on, and the image signal amplifier 805 is reset, thereby resetting the potentials of each signal line 308 (Sig1 to Sig3) and sensor lower electrode 309.

After the sensor bias line 314 is connected to the refresh bias 807 for a time enough to sweep electric charge out of the interface, the switch is switched to a storage bias 806 to switch the MIS type photoelectric conversion unit 202 (s11 to s33) to the photoelectric conversion mode. At this time, the TFT 201 (TFT11 to TFT33) is turned on to reset the image signal amplifier 805 so as to sweep electric charge out of the MIS type photoelectric conversion unit 202 (s11 to S33), thus resetting the potentials of the signal line 308 (Sig1 to Sig3) and sensor lower electrode 309.

At this time, the Re/Ex switch 703 is set at Hi to disconnect the phototimer from the signal line 308 (Sig2) so as to reset the amplifier. The amplifier is completely reset before emission of X-rays, and the Re/Ex switch 703 is switched to connect the signal line 308 (Sig2) to the phototimer amplification unit 701, thereby preparing for storing operation.

During the emission of X-rays, the voltage value Vp_h output from the phototimer amplification unit 701 changes as shown in FIG. 8. When the voltage value Vp_h is set to a set value by the exposure control unit 702, the X-ray control signal XC is sent to the X-ray source 706 to stop emitting X-rays.

At this time, the TFT 201 (TFT11 to TFT33) is kept OFF, and the MIS type photoelectric conversion unit 202 (s11 to s33) is kept in the photoelectric conversion mode.

The above phototimer refresh operation is the operation of sweeping electric charge out of the phototimer detection unit 203. In this operation, while the signal line 308 (Sig2) is connected to the phototimer amplification unit 701, the reference power supply for the phototimer amplification unit 701 is switched to the refresh power supply 705, and at the same time, the phototimer amplification unit is reset.

After the electric charge stored in the phototimer detection unit 203 is sufficiently swept out, a control signal Re/Ex is controlled to connect the signal line 308 (Sig2) to the image signal amplifier 805 to shift to read operation.

In the read operation, a control signal RC (RC_Photo) is controlled to reset the capacitor of the image signal amplifier 805, and at the same time, the potential of the signal line 308 (Sig1 to Sig3) is reset before the electric charge stored in the MIS type photoelectric conversion unit 202 is sent to the signal amplification circuit 801. This operation is performed to equalize the potentials of the signal lines 308 (Sig1 to Sig3), which have been varied by the storing operation and read operation.

After the image signal amplifier 805 and signal line 308 are completely reset, the voltage of the gate electrode 302 (e.g., the gate voltage Vg1) is raised until the TFTs 201 (e.g., the TFT11, TFT12, and TFT13) are turned on, and the TFTs 201 are kept ON for a sufficient time for the transfer of the electric charge stored in the MIS type photoelectric conversion unit 202. After the transfer, the voltage of the gate electrode 302 is lowered to turn off the TFTs 201.

At this time, each image signal amplifier 805 outputs a voltage proportional to the electric charge stored in the MIS type photoelectric conversion unit 202. The sample/hold circuit 804 is controlled by the control signal SH to sample/hold the voltage of each image signal amplifier 805.

This voltage is time-serially read by the multiplexer circuit 803 in synchronism with the input CLK signal CLK, and is output outside the two-dimensional sensor by the output stage amplifier 802.

By repeatedly resetting the signal line 308 and image signal amplifier 805 and turning on/off each TFT 201 by the number of times corresponding to the number of gate electrodes 302 (Vg), an X-ray image having undergone proper exposure control can be obtained.

As described above, in this embodiment, an optical sensor (phototimer detection unit 203) corresponding to a conventional photomultiplier is incorporated in the two-dimensional sensor 808 (on the signal line 308), and a signal from the phototimer detection unit 203 is integrated and monitored to perform exposure control. This allows the X-ray imaging apparatus to incorporate the phototimer detection unit 203 without affecting the aperture ratio of pixels which influence the performance of the X-ray imaging apparatus and the characteristics of the MIS type photoelectric conversion unit 202. This makes it possible to easily and reliably realize an X-ray imaging apparatus which can perform proper exposure control.

In addition, since the phototimer detection unit 203 is based on the same principle as that of the two-dimensional sensor 808, and the phosphor 317 for converting X-rays into light is shared by the phototimer detection unit 203 and two-dimensional sensor 808, the characteristics of the phototimer can be matched with those of the two-dimensional sensor 808. This can perform more suitable exposure control.

(Second Embodiment)

The second embodiment of the present invention will be described next. This embodiment mainly differs from the first embodiment in the arrangement of a two-dimensional sensor. The same reference numerals as in FIGS. 1 to 8 in the first embodiment denote the same parts in the second embodiment, and hence a detailed description thereof will be omitted.

Figure 9:
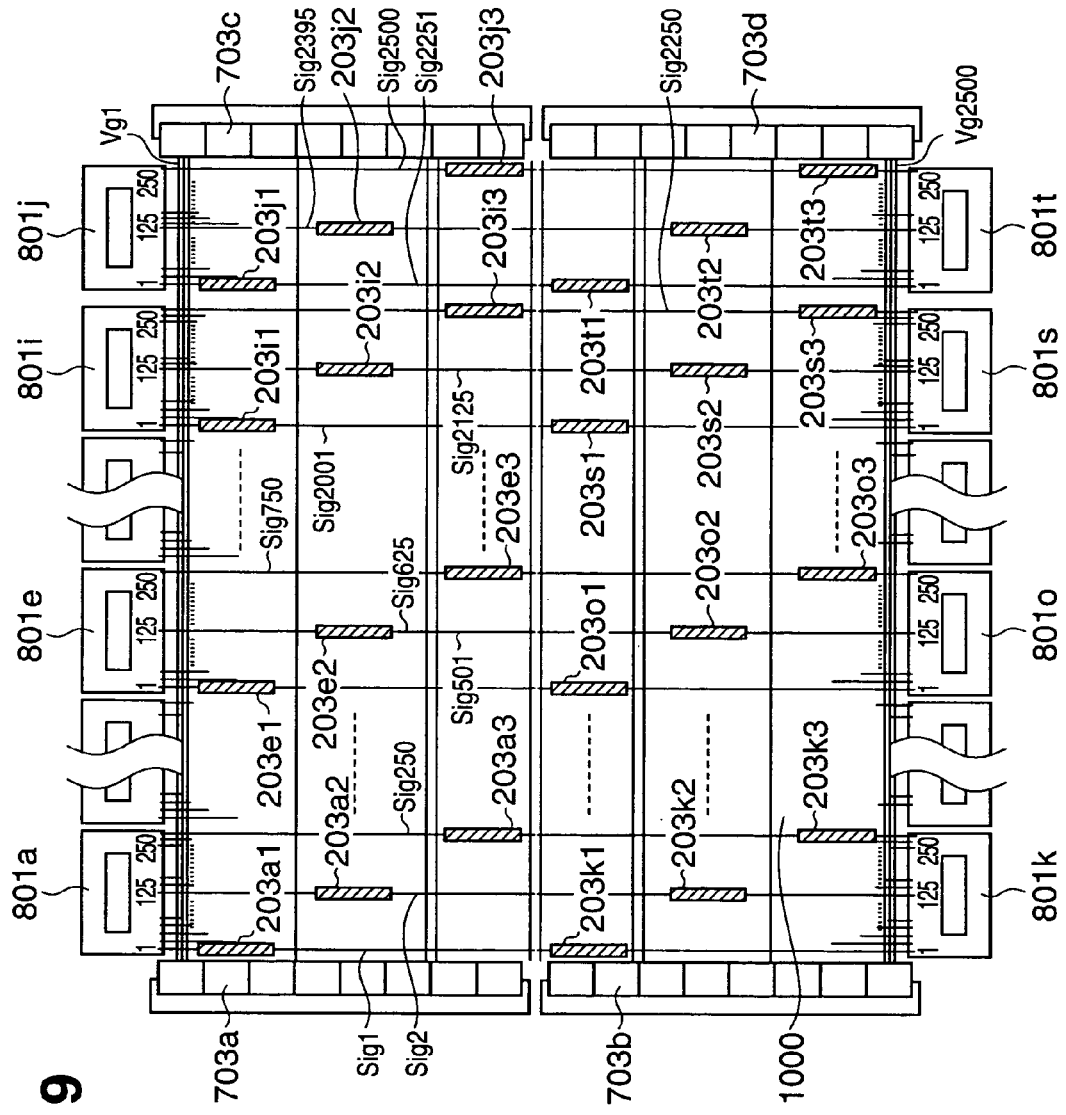
FIG. 9 is a view showing an example of the arrangement of a photoelectric conversion apparatus according to the second embodiment of the present invention.

FIG. 9 shows the schematic arrangement of a photoelectric conversion apparatus according to this embodiment. More specifically, FIG. 9 shows the photoelectric conversion apparatus in which pluralities of signal amplification circuits and vertical driving circuits are connected to a sensor substrate on which 2,500×2,500 pixels are arranged.

A total of 20 signal amplification circuits 801 shown in FIG. 7 are connected to the sensor substrate, 10 circuits each on the upper and lower sides in FIG. 9. One signal amplification circuit 801 is connected to 250 signal lines Sig. As shown in FIG. 9, phototimer detection units 203 can be connected to three of the 250 signal lines Sig connected to each signal amplification circuit 801. Although not shown in FIG. 9, circuits like phototimers correspond to those shown in FIG. 7.

In a two-dimensional sensor 1000 shown in FIG. 9, 1,250 pixels are connected to one signal line sig, and a total of 2,500 pixels are connected to upper and lower signal lines. Image signals are simultaneously read through the upper and lower signal lines. The time required to read image data can be shortened by dividing the pixels into upper and lower groups.

Vertical driving circuits 703 are arranged at four positions, i.e., upper left, upper right, lower left, and lower right positions. Left and right vertical driving circuits (e.g., vertical driving circuits 703*a* and 703*c*) share a gate electrode Vg and are synchronously driven. This makes it possible to prevent a deterioration in image quality due to the resistance and capacitance of the gate electrode Vg.

As shown in FIG. 9, three phototimer detection units 203 are arranged in group per signal amplification circuit 801, and are arranged so as not be juxtaposed.

The phototimer detection units 203 are consecutively arranged on one signal line Sig throughout several pixels to ten-odd pixels to function as one detection unit. This can make the sensitivity of the phototimer equal to or higher than that of a photoelectric conversion element (e.g., the MIS type photoelectric conversion unit 202).

Assume that a plurality of phototimer detection units are arranged in one place to have the same sensitivity as that of one pixel. In this case, since there is no need to perform special electrical correction, exposure control can be facilitated. In addition, high-precision exposure control can be performed with the characteristics of the photoelectric conversion unit (e.g., the MIS type photoelectric conversion unit 202) being reflected in the control.

Assume that a plurality of phototimer detection units are arranged to have a higher sensitivity than one pixel. In this case, even if the photoelectric conversion unit (e.g., the MIS type photoelectric conversion unit 202) is irradiated with a small amount of light, i.e., the amount of X-rays transmitted through the human body is small, exposure control can be accurately performed in the corresponding region.

Note, however, that when phototimer detection units are arranged in this manner, the sensitivity characteristics of the phototimer detection units must be controlled on the basis of the sensitivity characteristics of a pixel.

In this case, phototimer detection units having sensitivity equal to or higher than that of the above pixel may be arranged in one two-dimensional sensor 1000.

Providing the phototimer detection units 203 in the entire region of the two-dimensional sensor 1000 as shown in FIG. 9 can obtain optimal exposure under any radiographic conditions.

For example, optimal exposure control can be done for a region to be radiographed by designating, in accordance with the region to be radiographed, an area in which the amount of light is measured.

(Third Embodiment)

The third embodiment of the present invention will be described next. Note that the first and third embodiments differ in the detailed arrangement of a photoelectric conversion element. More specifically, the first embodiment uses a MIS type photoelectric conversion unit as a photoelectric conversion element, whereas the third embodiment uses a PIN type photoelectric conversion unit as a photoelectric conversion element. The same reference numerals as in FIGS. 1 to 8 in the first embodiment denote the same parts in the third embodiment, and hence a detailed description thereof will be omitted.

Figure 10:
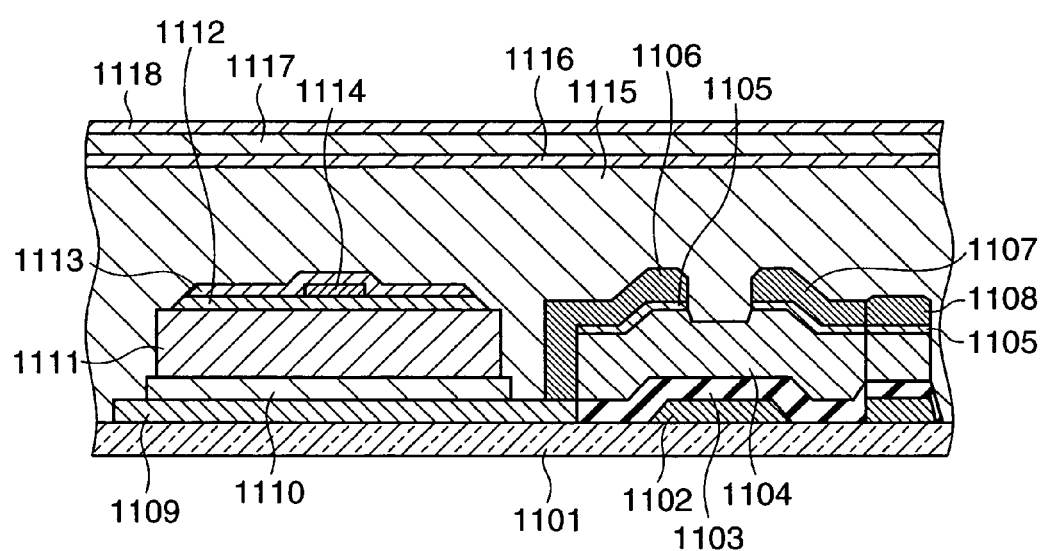
FIG. 10 is a sectional view of a pixel formed from a combination of a PIN type photoelectric conversion unit and a TFT according to the third embodiment of the present invention.

FIG. 10 is a sectional view of a pixel formed from a combination of a PIN type photoelectric conversion unit as a photoelectric conversion element and a TFT as a transfer device.

Like the TFT 201 in the first embodiment described above, the TFT is constituted by a gate electrode 1102 made of chromium, aluminum, or an aluminum alloy and formed on a glass substrate 1101, an insulating film 1103 formed from an amorphous silicon nitride film, a channel layer 1104 made of amorphous silicon hydride (a-Si: H), an N$^+$ amorphous silicon layer 1105 having n-type conductivity which is formed to obtain ohmic contact between the channel layer 1104 and a metal electrode, and source and drain electrodes 1106 and 1107 made of a metal such as aluminum or an aluminum alloy.

The PIN type photoelectric conversion unit is constituted by a sensor lower electrode layer 1109 made of aluminum or an aluminum alloy, an N$^+$ amorphous silicon layer 1110 having n-type conductivity which is formed to block the injection of holes from the sensor lower electrode layer 1109 into a photoelectric conversion layer 1111, the photoelectric conversion layer 1111 made of amorphous silicon hydride, a P$^+$ amorphous silicon layer 1112 having p-type conductivity which is formed to block the injection of electrons from a sensor bias line 1114 and transparent electrode 1113 into the photoelectric conversion layer 1111, the sensor bias line 1114 which is made of aluminum or an aluminum alloy to apply a voltage to the PIN type photoelectric conversion unit, and the transparent electrode 1113 made of a transparent electrode material such as ITO.

Like the phototimer detection unit 203 in the first embodiment described above, a phototimer detection unit is formed in a signal line 308, and has the same structure as that shown in FIG. 3. As described above, this embodiment uses optical sensors based on different schemes for a phototimer detection unit and a photoelectric conversion element.

A phototimer detection unit in this embodiment operates based on the same operation principle as that described with reference to FIG. 4 in the first embodiment. However, a PIN type photoelectric conversion unit is designed to output an electrical signal proportional to light on the basis of the principle shown in FIGS. 11A and 11B.

Figure 11A:
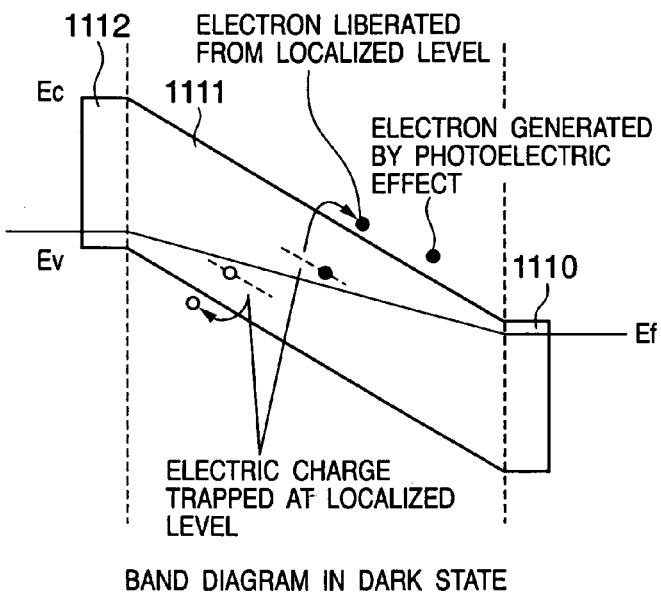
FIGS. 11A and 11B are views showing the band diagram of a PIN type photoelectric conversion unit according to the third embodiment of the present invention.
Figure 11B:
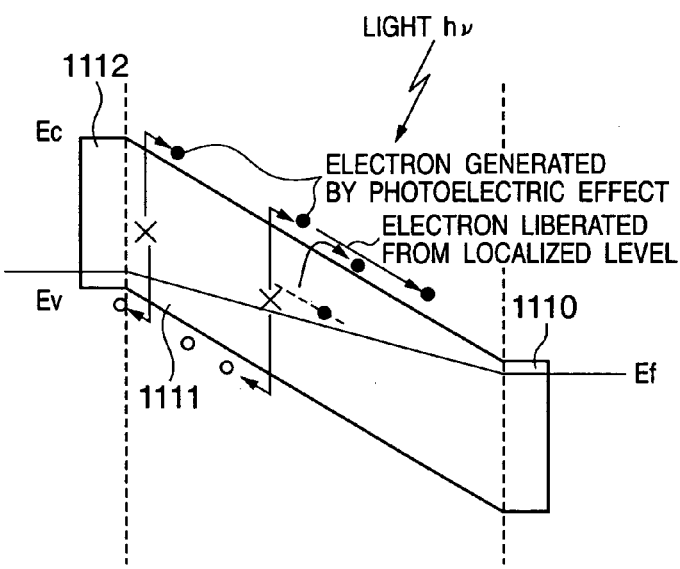

Each of FIGS. 11A and 11B shows the band diagram of the PIN type photoelectric conversion unit in a state wherein a negative voltage is applied to the P$^+$ amorphous silicon layer 1112 of the PIN type photoelectric conversion unit or in a state wherein a positive voltage is applied to the N$^+$ amorphous silicon layer 1110.

FIG. 11A shows a state wherein the PIN type photoelectric conversion unit is irradiated with no light. In this state, a voltage is applied across the PIN type photoelectric conversion unit, and electrons are injected into the P$^+$ amorphous silicon layer 1112 while holes are injected into the N$^+$ amorphous silicon layer 1110.

The injected electrons and holes recombine in the N$^+$ amorphous silicon layer 1110 and P$^+$ amorphous silicon layer 1112 and cannot flow to the counter electrode through the photoelectric conversion layer 1111. In this state, therefore, no current flows in the PIN type photoelectric conversion unit.

However, the electric charge trapped in the photoelectric conversion layer 1111 is thermally discharged and flows outside the photoelectric conversion layer 1111 owing to the voltage applied across the PIN type photoelectric conversion unit. For this reason, a current (dark current) flows, although its amount is smaller than that of current generated by photoelectric conversion.

FIG. 11B shows a state wherein the PIN type photoelectric conversion unit in the state in FIG. 11A is irradiated with light.

When the photoelectric conversion unit is irradiated with light, electron-hole pairs are generated in the photoelectric conversion layer. Owing to the voltage applied to the photoelectric conversion layer 1111, the electrons drift to the N$^+$ amorphous silicon layer 1110, and the holes drift to the P$^+$ amorphous silicon layer 1112. In this case, a current proportional to the amount of light can be obtained by setting the voltage applied to the PIN type photoelectric conversion unit such that the drift times of electrons and holes in the photoelectric conversion layer 1111 become sufficiently shorter than their lifetimes.

A characteristic feature of a PIN type photoelectric conversion unit is that no refresh operation is required unlike a MIS type photoelectric conversion unit. In this embodiment, since a PIN type photoelectric conversion unit is used as a photoelectric conversion element, refresh operation described in the first embodiment can be omitted.

(Fourth Embodiment)

The fourth embodiment of the present invention will be described next. In this embodiment, a digital X-ray imaging apparatus is formed by using the photoelectric conversion apparatus descried in the first to third embodiments. The same reference numerals as in FIGS. 1 to 11 in the first to third embodiments denote the same parts in the fourth embodiment, and a detailed description thereof will be omitted.

Figure 12:
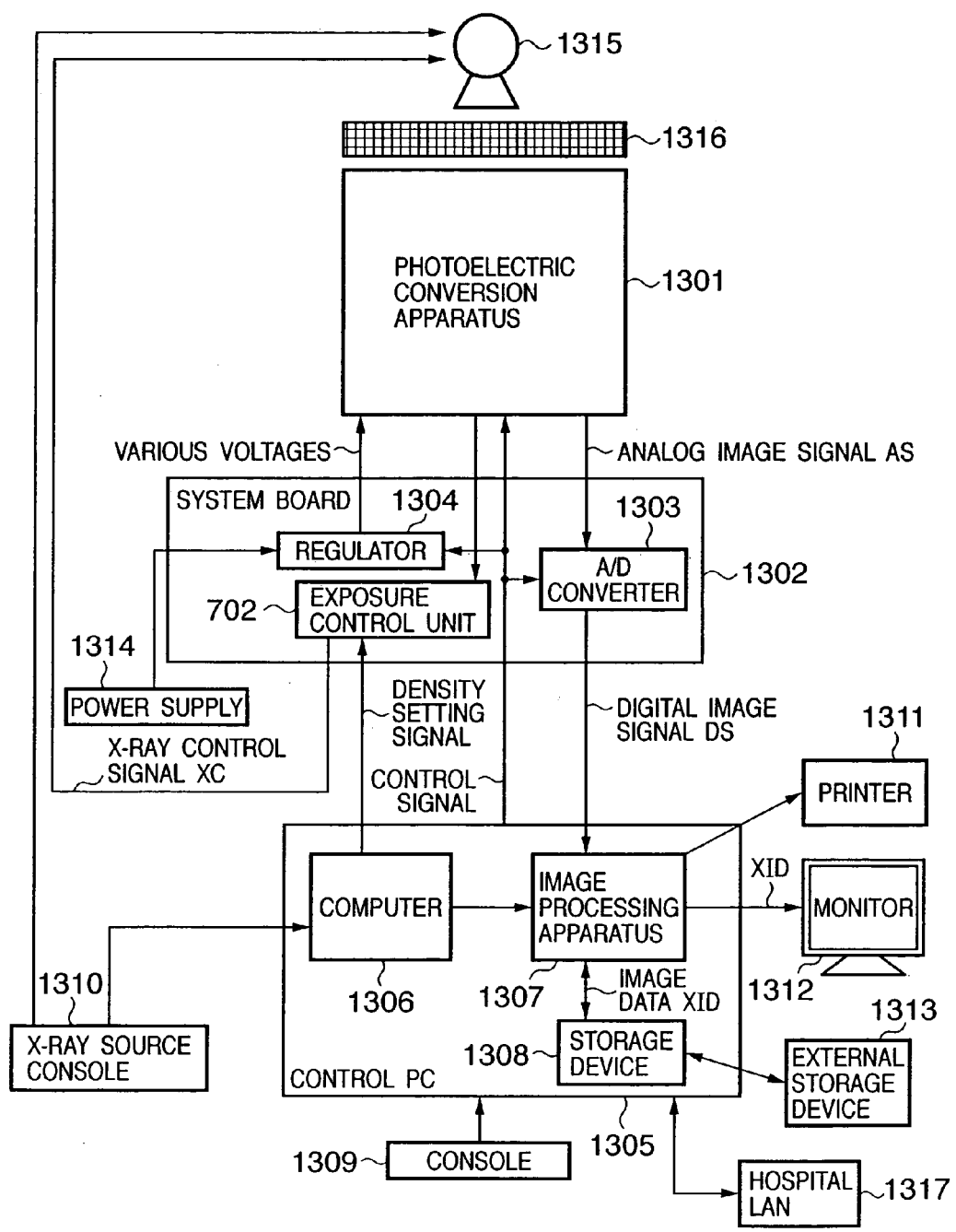
FIG. 12 is a block diagram showing an example of the system arrangement of a digital X-ray imaging apparatus according to the fourth embodiment of the present invention.
Figure 13:
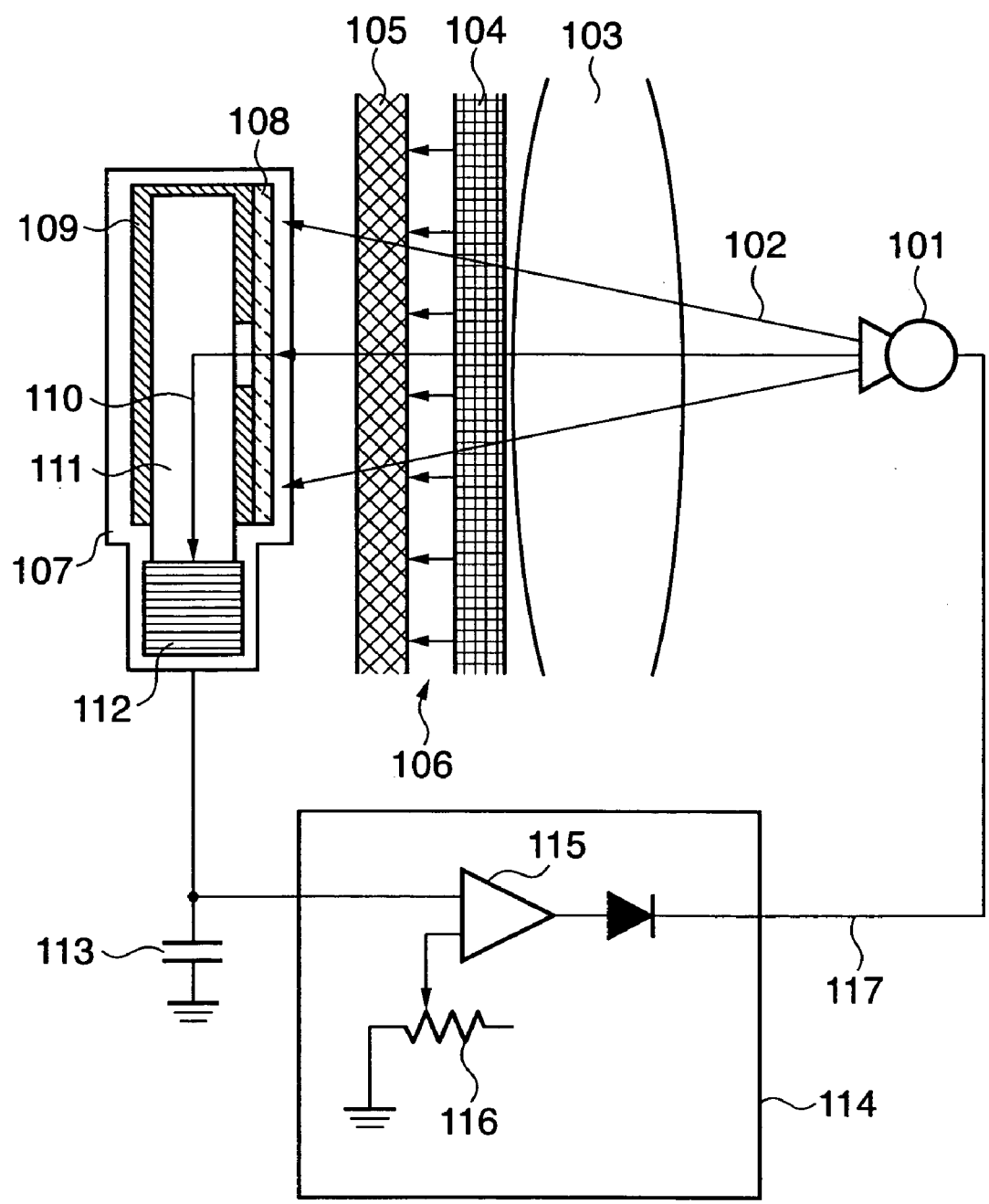
FIG. 13 is a view showing the arrangement of a phototimer according to the prior art.

FIG. 12 is a view showing an example of the system arrangement of a digital X-ray imaging apparatus using the photoelectric conversion apparatus described in the first to third embodiments.

Referring to FIG. 12, a photoelectric conversion apparatus 1301 is one of the photoelectric conversion apparatuses in the first to third embodiments described with reference to FIGS. 7 to 9.

A system board 1302 incorporates an A/D converter 1303 which converts an analog image signal AS output from the signal amplifier (signal amplification circuit 801) of the photoelectric conversion apparatus 1301 into a digital image signal DS, an exposure control unit 702 which monitors the voltage output from a phototimer amplification unit 701 and controls an X-ray source 1315 to obtain optimal exposure, and a regulator 1304 for regulating the voltage applied from a (external) power supply 1314 into a voltage for driving sensors (e.g., two-dimensional sensors 808 and 1000) and circuits attached to the sensors.

A control PC 1305 is constituted by a computer 1306 which calculates an optimal exposure from the input information of X-ray irradiation conditions and a radiographic region, and if there are a plurality of phototimer detection units 203, determines one of the phototimer detection units 203, determines a signal from which is to be used, and sends a density setting signal to the exposure control unit 702, and an image processing apparatus 1307 which corrects artifacts due to sensors (e.g., the two-dimensional sensors 808 and 1000) and the signal amplification circuit 801 so as to form the digital data (digital image signal DS) sent from the A/D converter 1303 into a proper X-ray image, and also makes correction to obtain contrast suitable for diagnosis from the exposure control information and radiographic region information sent from the computer 1306.

The X-ray image (image data XID) generated by the image processing apparatus 1307 can be displayed on a monitor 1312, recorded on a storage device 1308 such as a magnetic disk drive, or transferred to a hospital LAN (Local Area Network) 1317.

A console 1309 is a device which inputs patient information and radiographic conditions such as an X-ray tube voltage, tube current, and radiographic region. The control PC 1305 controls the two-dimensional sensors 808 and 1000 on the basis of the input information.

An X-ray source console 1310 is used to set a tube voltage, tube current, and emission time. The X-ray source 1315 is driven on the basis of this information. The information input to the X-ray source console 1310 is sent to the computer of the control PC 1305 to be used for calculation for exposure control.

As described above, in this embodiment, since the digital X-ray imaging apparatus is formed by using the photoelectric conversion apparatus described in the first to third embodiments, optical exposure control can be performed by using the phototimers formed in the two-dimensional sensor, thereby obtaining a digital X-ray image suitable for diagnosis. This makes it possible to improve X-ray image diagnosis and reduce the dose of a patient by reducing radiographic errors.

A digital X-ray imaging apparatus which can obtain optimal exposure regardless of the radiographic region can be provided by using the two-dimensional sensor 1000 according to the second embodiment in which the phototimers are arranged in the entire area of the photoelectric conversion apparatus (the phototimer detection units are arranged in the entire area of the two-dimensional sensor).

Note that the exposure control unit 702 may be incorporated in the control PC 1305, and the regulator 1304 may be independently connected, as a regulator, to the photoelectric conversion apparatus instead of being mounted on the system board 1302.

(Other Embodiment of the Present Invention)

The present invention also incorporates the following arrangement within its category. In this arrangement, in order to make the respective devices to operate so as to realize the functions of the above embodiments, the program codes of software for realizing the functions of the above embodiments are supplied to a computer in an apparatus or system connected to the respective devices, thereby causing the computer (CPU or MPU) in the system or apparatus to operate the respective devices in accordance with the program codes.

In this case, the program codes of the software themselves realize the functions of the above embodiments, and the program codes themselves and a supplying unit for supplying the program codes to the computer, i.e., a recording medium in which the program codes are stored, constitute the present invention. As a recording medium storing such program codes, for example, a flexible disk, hard disk, optical disk, magnetooptical disk, a CD-ROM, a magnetic tape, nonvolatile memory card, a ROM, or the like can be used.

Obviously, the above program codes are included in the embodiments of the present invention not only in a case wherein the functions of the above embodiments are realized when the computer executes the supplied program codes but also in a case wherein the functions of the above embodiments are realized by the program codes in cooperation with the OS (Operating System), another application software, or the like running on the computer.

In addition, the present invention incorporates a case wherein the supplied program codes are stored in the memory of a function expansion board in the computer or a function expansion unit connected to the computer, the CPU of the function expansion board or function expansion unit performs part or all of actual processing on the basis of the instructions of the program codes, and the functions of the above embodiments are realized by the processing.

As has been described above, according to the present invention, a common path is used both as a signal transmission path which connects a transfer device for transferring the electric charge generated by a photoelectric conversion element which converts radiation or visible light into an electrical signal to a read unit for amplifying and reading the electric charge transferred by the transfer device and a signal transmission path for a phototimer detection unit for detecting the radiation or visible light for exposure control. This makes it possible to incorporate the phototimer detection unit without affecting the characteristics of the photoelectric conversion element. Therefore, radiography can be done by easily and reliably performing high-precision exposure control.

As many apparently widely different embodiments of the present invention can be made without departing from the spirit and scope thereof, it is to be understood that the invention is not limited to the specific embodiments thereof except as defined in the appended claims.

What is claimed is:

1. An imaging apparatus comprising:
    a two-dimensional sensor having a plurality of pixels two-dimensionally arranged on a substrate and a signal line on said substrate, each pixel having a photoelectric conversion element which converts radiation or visible light into an electrical signal and a transfer device for transferring the electrical signal generated by the photoelectric conversion element to said signal line;
    a first read unit, which is connected to said signal line, for amplifying and reading the electrical signal transferred to said signal line by the transfer device;
    a phototimer detection unit, which is arranged on said substrate, for detecting the radiation or visible light and generating a detected signal and transferring the detected signal to said signal line to control exposure of the radiation or visible light; and a second read unit, which is connected to said signal line, for reading the detected signal detected by said phototimer detection unit from said signal line.

2. The apparatus according to claim 1, wherein one or a plurality of phototimer detection unit each identical to said phototimer detection unit are provided in the same place as that of said signal line.

3. The apparatus according to claim 1, wherein said phototimer detection unit is manufactured by substantially the same manufacturing process as that for the photoelectric conversion element or the transfer device.

4. The apparatus according to claim 1, wherein
said photoelectric conversion element has, on an insulating substrate,
a first electrode layer,
a first insulating layer,
a photoelectric conversion semiconductor layer formed from a non-single crystal semiconductor,
a second electrode layer,
an injection blocking layer which is formed between the second electrode layer and the photoelectric conversion semiconductor layer and blocks injection of carriers having a first conductivity type into the photoelectric conversion semiconductor layer, and
a third electrode layer made of a metal, and
the second electrode layer is formed on the injection blocking layer and is transparent to visible light.

5. The apparatus according to claim 1, wherein the photoelectric conversion element includes
an insulating substrate,
a first electrode layer formed on the insulating substrate,
a first insulating layer formed on the first electrode layer,
a photoelectric conversion semiconductor layer formed on the first insulating layer by using a non-single crystal semiconductor,
an injection blocking layer which is formed on the photoelectric conversion semiconductor layer and blocks injection of carriers having a first conductivity type into the photoelectric conversion semiconductor layer,
a second electrode layer which is formed on the injection blocking layer and transparent to visible light, and
a third electrode layer formed between the second electrode layer and the photoelectric conversion semiconductor layer by using a metal.

6. The apparatus according to claim 1, wherein the photoelectric conversion element includes, on an insulating substrate,
a first electrode layer,
a first injection blocking layer which blocks injection of electric charge having a first conductivity type,
a photoelectric conversion semiconductor layer made of an amorphous semiconductor,
a second injection blocking layer which blocks injection of electric charge having a second conductivity type different in sign from the electric charge of the first conductivity type,
a second electrode layer which is formed on the second injection blocking layer and transparent to visible light, and
a third electrode layer made of a metal.

7. The apparatus according to claim 1, wherein the photoelectric conversion element includes
an insulating substrate,
a first electrode layer formed on the insulating substrate;

a first injection blocking layer which is formed on the first electrode layer and blocks injection of carriers having a first conductivity type,
a photoelectric conversion semiconductor layer formed on the first injection blocking layer by using a non-single semiconductor,
a second injection blocking layer which is formed on the photoelectric conversion semiconductor layer and blocks injection of carriers having a second conductivity type different in sign from the carriers of the first conductivity type,
a second electrode layer which is formed on the second injection blocking layer and transparent to visible light, and
a third electrode which is formed between the second electrode layer and the second injection blocking layer by using a metal.

8. An X-ray imaging apparatus comprising:
an imaging apparatus; and
a phosphor which is arranged on a light-receiving surface of said imaging apparatus,
wherein
said imaging apparatus comprising:
a two-dimensional sensor having a plurality of pixels two-dimensionally arranged on a substrate and a signal line on said substrate, each pixel having a photoelectric conversion element which converts radiation or visible light into an electrical signal and a transfer device for transferring the electrical signal generated by the photoelectric conversion element to said signal line;
a first read unit, which is connected to said signal line, for amplifying and reading the electrical signal transferred to said signal line by the transfer device;
a phototimer detection unit, which is arranged on said substrate, for detecting the radiation or visible light and generating a detected signal and transferring the detected signal to said signal line to control exposure of the radiation or visible light; and
a second read unit, which is connected to said signal line, for reading the detected signal detected by said phototimer detection unit from said signal line,
wherein said phosphor converts X-rays into visible light.

9. The X-ray imaging apparatus according to claim 8, further comprising
an exposure control unit for determining an exposure from an electrical signal based on the detected electrical signal read by said second read unit, and controls an X-ray source to obtain an image having an optimal contrast.

10. An imaging apparatus, comprising:
a two-dimensional sensor having a plurality of pixels two-dimensionally arranged on a substrate and a signal line on said substrate, each pixel having a photoelectric conversion element which converts radiation or visible light into an electrical signal and a transfer device for transferring the electrical signal generated by the photoelectric conversion element to said signal line;
a read unit, which is connected to said signal line, for amplifying and reading the electrical signal transferred to said signal line by the transfer device;
a phototimer detection unit, which is arranged on said substrate, for detecting the radiation or visible light and generating a detected signal and transferring the detected signal to said signal line to control exposure of the radiation or visible light; and wherein said phototimer detection unit is arranged in the same place as that of said signal line.

11. The apparatus according to claim 10, further comprising a second read unit for reading electrical signal from said phototimer detection unit, wherein said second read unit is connected to said signal line.

12. The apparatus according to claim 10, wherein said signal line includes a transparent electrode, which is transparent to visible light, on an area in which said phototimer detection unit is arranged.

* * * * *